United States Patent [19]

McCusker et al.

[11] 4,126,838
[45] Nov. 21, 1978

[54] UNIFORM SURFACE ACOUSTIC WAVE TRANSDUCER CONFIGURATION HAVING IMPROVED FREQUENCY SELECTIVITY

[75] Inventors: Joseph H. McCusker; Stuart S. Perlman, both of Princeton, N.J.

[73] Assignee: RCA Corporation, New York, N.Y.

[21] Appl. No.: 836,421

[22] Filed: Sep. 26, 1977

[51] Int. Cl.$^2$ .................. H03H 9/04; H03H 9/26; H01L 41/10

[52] U.S. Cl. .................. 333/72; 310/313; 333/30 R; 358/188

[58] Field of Search .................. 333/30 R, 71, 72; 310/313; 358/21, 36, 38, 166, 167, 188, 201

[56] References Cited

U.S. PATENT DOCUMENTS

| | | | |
|---|---|---|---|
| 3,792,381 | 2/1974 | Bristol | 333/72 |
| 3,801,937 | 4/1974 | Bristol | 333/72 |
| 3,979,702 | 9/1976 | Hunsinger et al. | 333/72 |

Primary Examiner—Alfred E. Smith
Assistant Examiner—Marvin Nussbaum
Attorney, Agent, or Firm—Eugene M. Whitacre; Paul J. Rasmussen; Peter M. Emanuel

[57] ABSTRACT

The IF portion of a television receiver includes a surface acoustic wave filter comprising at least two conductors having electrodes extending therefrom to form comb-shaped elements mounted on one surface of a piezoelectric substrate. Respective electrodes of the comb-shaped elements are interleaved in alternated relationship to form a transducer for launching an acoustic signal along the surface of the substrate in response to an electrical signal coupled between the two conductors. The overlap of each pair of alternated electrodes is substantially uniform throughout the transducer. The transducer includes two end portions and a center portion between the end portions. However, because the location of the center of each pair of alternated electrodes from the location of the center of an adjacent pair of alternated electrodes is substantially the same throughout the transducer, the transducer is continuous. The end portions are arranged with respect to the center portion to generate acoustic signals which have amplitudes less than, and desirably at least approximately equal to one-half, the amplitude of the acoustic signal generated by the center portion so as to minimize the amplitudes of undesirable sidelobes which tend to reduce the frequency selectivity of the SAW filter. In preferred embodiments, the amplitudes of components generated by the end portions are electrically adjustable to control the frequency selectivity of the SAW filter.

18 Claims, 5 Drawing Figures

UNIFORM SURFACE ACOUSTIC WAVE TRANSDUCER CONFIGURATION HAVING IMPROVED FREQUENCY SELECTIVITY

BACKGROUND OF THE INVENTION

The present invention pertains to the field of surface acoustic wave devices.

Surface acoustic wave (SAW) devices are microsonic devices which typically include a piezoelectric substrate and at least two comb-shaped conductive elements mounted on one surface of the substrate. Comb-shaped elements include teeth-like electrodes which are interleaved in alternated relationship to form an input transducer for launching acoustic signals along the surface of the substrate in response to an input electrical signal coupled to the comb-shaped elements. The acoustic signals are received by an output transducer constructed in a manner similar to the input transducer and converted into an output electrical signal. By selecting the amount of overlap between the two electrodes included in each pair of alternated electrodes and spacing between the pairs of alternated electrodes, a desired amplitude versus frequency response, such as, for example, the IF filter portion of a television receiver, may be obtained. SAW devices are desirable with respect to conventional filter circuitry constructed from discrete components because they are relatively small in size, readily manufactured by etching techniques and tend to be consistent from piece to piece.

One of the difficulties associated with SAW devices which have thus far kept them from being widely employed in television receivers and the like concerns the amplitude ratios of their out-of-band to in-band frequency responses which include undesired sidelobes of significant amplitudes compared with respect to the peak amplitude of the desired passband. In terms of the IF filter portion of a television receiver, this means that undesired adjacent channel signal components may have amplitude comparable with the amplitudes of signal components of the desired channel. SAW devices in which both input and output transducers are uniform, that is, transducers in which the amount of overlap of the two electrodes in each pair of alternated electrodes is substantially the same throughout the transducer, tend to have amplitude versus frequency responses in which the ratio of the largest sidelobe amplitude and the largest passband amplitude is below −26.4 dB (decibels) and therefore not particularly suitable for the IF portion of a television receiver. On the other hand, SAW devices in which at least either the input or output transducer is nonuniform, that is, a transducer which the overlap of the two electrodes in each electrode pair is not substantially uniform throughout the transducer, are capable of providing amplitude versus frequency responses suitable for the IF portion of a television receiver in which the ratio between the largest sidelobe amplitude and the largest passband amplitude exceeds −40 dB. Unfortunately, because the achievement of a desired amplitude versus frequency comes at the expense of added numbers of pairs of alternate electrodes, nonuniform transducers usually require many more pairs of alternated electrodes than do uniform transducers, therefore, nonuniform transducers are relatively large and expensive compared with uniform transducers. Furthermore, because the average amount of overlap of all the pairs of alternated electrodes of nonuniform transducers tends to be less than that of uniform transducers and the average amount of overlap of a transducer is related to its energy conversion efficiency, nonuniform transducers tend to be less efficient than do uniform transducers. In addition, because the amplitude of a surface acoustic wave launched by a nonuniform transducer is not constant across its wave front, the combined amplitude versus frequency response of a nonuniform transducer and another nonuniform transducer will in general not be the product of the two respective transducers.

While transducer configurations have been suggested for improving the frequency selectivity of SAW devices (see, for example, U.S. Pat. Nos. 3,801,937 and 4,006,438) these configurations exhibit one or more of the disadvantages set forth above. Thus, a transducer for use in the IF portion of a television receiver and the like should have the frequency selectivity characteristics of nonuniform transducers but the size, cost and energy conversion characteristics of a uniform transducer.

SUMMARY OF THE PRESENT INVENTION

A SAW device includes at least two conductors having electrode means extending therefrom to form comb-shaped elements mounted on one surface of a piezoelectric substrate. Respective electrode means of the comb-shaped elements are interleaved in alternated relationship to form a single transducer for launching an acoustic signal along the surface of the substrate in response to an electrical signal. The overlap of each pair of alternated electrodes is substantially uniform throughout the transducer. The transducer includes two end portions and a center portion between the end portions, but because the location of the center of each pair of alternated electrodes from the location of the center of an adjacent pair of alternated electrodes is substantially the same throughout the transducer, the transducer is continuous. In order that a transducer have an amplitude versus frequency response having sidelobes of relatively small amplitude suitable, for example, for an IF filter portion of a television receiver, the end portions include provisions whereby they generate signals (acoustic signals if the transducer is a launching input transducer and electrical if the transducer is a receiving or output transducer) which have amplitudes less than, and desirably at least approximately equal to one half, the amplitude of the signal generated by the center portion.

BRIEF DESCRIPTION OF THE DRAWING

FIGS. 4 and 5 show, in schematic diagram form, other transducer configurations constructed in accordance with the present invention which may be utilized in the SAW filter of FIG. 1.

DETAILED DESCRIPTION OF THE INVENTION

Figure 1:
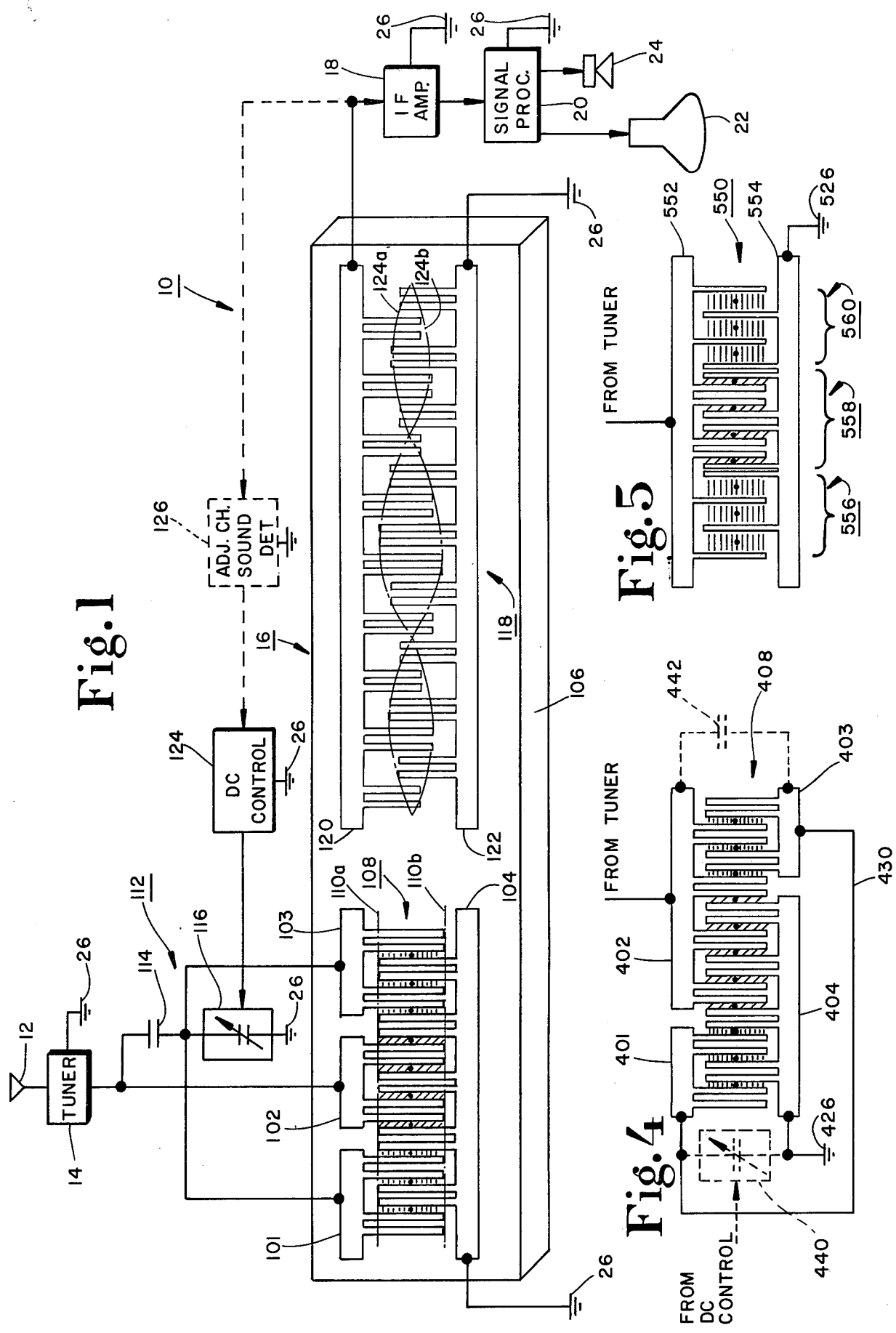
FIG. 1 shows, partially in block diagram form and partially in schematic diagram form, a color television receiver employing a SAW filter with a transducer configuration constructed in accordance with the present invention.

In color television receiver 10 of FIG. 1, RF signals received by an antenna 12 are coupled to a tuner 14 where they are combined with the local oscillator signal corresponding to the selected channel to form an IF signal. The IF signal includes modulated sound, color and picture carriers for the selected channel in a predetermined frequency range. For example, in the United States, the sound, color and picture carriers have respective frequencies of 41.25 MHz, 42.17 MHz and 45.75 MHz and lie in desired passbands between the higher adjacent channel picture carrier of 39.75 MHz and the lower adjacent channel sound carrier of 47.25 MHz. The IF signal is coupled to a SAW filter which has a predetermined amplitude versus frequency response characteristic selected to establish a predetermined amplitude ratio between the sound, color and picture carrier of the higher adjacent channel and the sound carrier of the lower adjacent channel. The output signal of SAW filter 16 is coupled through an IF amplifier 18 to a signal processing unit 20 which processes the sound, color and picture carriers of the selected channel in order to provide a display by means of a picture tube 22 and audio response by means of a speaker 24.

SAW filter 16 includes four comb-shaped conductive elements 101, 102, 103 and 104, each formed by a conductive strip having split electrodes extending therefrom in substantially parallel relationship, mounted on one surface of a piezoelectric substrate 106 such as lithium niobate. Comb-shaped elements 101, 102 and 103 are in general alignment with each other and opposite comb-shaped element 104. Electrodes of comb-shaped elements 101 and 104 are interleaved in alternate relationship to form a first (left) end of a transducer 106; electrodes of comb-shaped elements 102 and 104 are interleaved in alternated relationship to form a center portion of transducer 108; and electrodes of comb-shaped elements 103 and 104 are interleaved in alternated relationship to form a second (right) end portion of transducer 108. The split electrodes in each pair of alternated electrodes in transducer 108 overlap each other. The overlap of the electrodes in the pairs of alternated electrodes in the first and second portions of transducer 108 are symbolically identified by small horizontal lines and the overlap of the electrodes in the pairs of alternated electrodes in the center portion of transducer 108 are symbolically identified by slanted horizontal lines.

As is indicated by parallel lines 110a and 110b, the overlaps of each pair of alternated electrodes are substantially the same throughout transducer 108. As a result, transducer 108 is said to be uniform or unapodized. The location of each pair of alternated electrodes within transducer 108 is determined by the center position midway between the alternated electrodes in the pair. The spacings between adjacent center positions, indicated symbolically by dots, are substantially the same throughout transducer 108 so that it is continuous as is a conventional uniform transducer. Desirably, the spacings between adjacent center positions are selected to be equal to $\frac{1}{2}(v/f_o)$, where $f_o$ is the center frequency of the desired passband of IF SAW filter 16 and $v$ is the effective surface wave velocity in the direction of propagation (i.e., the direction perpendicular to the electrodes of substrate 106).

Comb-shaped element 104 is coupled to signal ground 26. The IF signal, referenced to signal ground, generated by tuner 14 is directly coupled to comb-shaped element 102. The IF signal is also coupled to a voltage divider network 112 comprising the series connection of capacitors 114 and 116 between the output of tuner 14 and signal ground 26. An alternated amplitude portion of the IF signal, developed at the junction of capacitors 114 and 116, is coupled to comb-shaped transducers 101 and 103.

In response to the respective electrical signals coupled to the first, center and end portions of transducer 108, an acoustic signal is launched along the surface of piezoelectric substrate 106. The surface acoustic wave is received by a transducer 114 comprising two comb-shaped elements 118 and 120 having respective split electrodes thereof interleaved in alternated fashion. As is indicated by lines 124a and 124b, the overlap of the pairs of alternated electrodes is nonuniform and as a result transducer 108 is a nonuniform or apodized transducer. Comb-shaped element 120 is coupled to the input of IF amplifier 18 and comb-shaped element 122 is coupled to signal ground 26. Transducer 118 connects the surface acoustic signal launched by transducer 108 and converts it to an electrical signal referenced to signal ground 26 which is coupled to the input of IF amplifier 18.

Unfortunately, a portion of the acoustic signal coupled to transducer 118 is not converted to the electrical signal coupled to IF amplifier 18 but is rather mechanically reflected back toward transducer 108. In turn, a portion of the reflected acoustic signal coupled to transducer 108 is mechanically re-reflected back toward transducer 108. To reduce such mechanical reflections between transducer 108 and 118, each electrode of transducers 108 and 118 are split, as earlier noted, and the two portions thereof are spaced apart by a distance $\frac{1}{8}(v/f_o)$ so that an acoustic signal reflected from one of the two electrode portions is cancelled by an out-of-phase acoustic signal reflected from the other.

Although transducers 108 and 118 are shown in FIG. 1 as having only a relatively few alternated electrode pairs for the sake of clarity, it will be appreciated that actual transducers may include relatively large numbers of pairs of alternated electrodes.

The desired passband characteristic of television receivers employed, for example, in the United States, should be generally rectangular between, exclusively, 39.75 MHz, i.e., the frequency of the higher adjacent channel picture carrier, and 47.25 MHz, i.e., the frequency of the lower adjacent sound carrier. Furthermore, in-band the color and picture carriers at 42.17 MHz and 45.75 MHz, respectively, should be attenuated about 3 dB with respect to the peak amplitude of the flat portion of the IF amplitude versus frequency response characteristic and the sound carrier at 41.25 MHz should be attenuated by about 20 dB with respect to the flat portion of the IF amplitude versus frequency response characteristic. In addition, the higher adjacent channel picture carrier at 39.75 MHz, the lower adjacent sound carrier at 47.25 MHz and the respective out-of-band regions should be attenuated as much as possible with respect to the in-band flat portions of the IF amplitude versus frequency response characteristic to inhibit adjacent channel interference.

The overlap pattern of output transducer 118, represented by lines 124a and 124b, is selected as a modified (Sin $x/x$) pattern, where $x$ is the distance along the length of transducer 118 from its center so as to provide the generally rectangular shape of the desired amplitude versus frequency response characteristic of IF SAW filter 16 in the manner set forth in an article entitled, "Surface Acoustic Wave Filter for Television Intermediate Frequencies" by Dr. J. A. van Raalte, appearing in the June/July 1974, volume 20, number 1, issue of the

*RCA Engineer* published by RCA Corporation, hereby incorporated by reference.

The overlap pattern of input transducer 108, represented by line 110a and 110b, is selected to be uniform rather than nonuniform because due to the nonuniform overlap pattern of a nonuniform pattern, the amplitude of a surface acoustic wave launched by a nonuniform transducer is not constant across its wave front and therefore the combined amplitude versus frequency response of a nonuniform transducer and another nonuniform transducer will in general not be the product of the two respective responses. Moreover, input transducer 108 is selected to be uniform because a uniform transducer requires less pairs of alternated electrodes than does a nonuniform transducer and therefore tends to be smaller and less expensive than a nonuniform transducer. Unfortunately, a conventional uniform transducer has an amplitude versus frequency response characteristic including undesired out-of-band sidelobes of relatively substantial amplitudes compared with the peak amplitude in the in-band portion of response characteristic and which therefore reduce the frequency selectivity of the overall SAW device. Specifically the amplitude versus response characteristic of a conventional uniform transducer has a $$\frac{\sin[\frac{N\pi(f-fo)}{2fo}]}{\frac{\pi(f-fo)}{2fo}} \quad (1)$$

amplitude versus frequency response characteristic, where $f$ is the frequency;

$fo$ is the center frequency of the desired amplitude versus frequency response (as earlier defined); and N is the number of overlap regions between alternated electrodes in the transducer.

Figure 2:
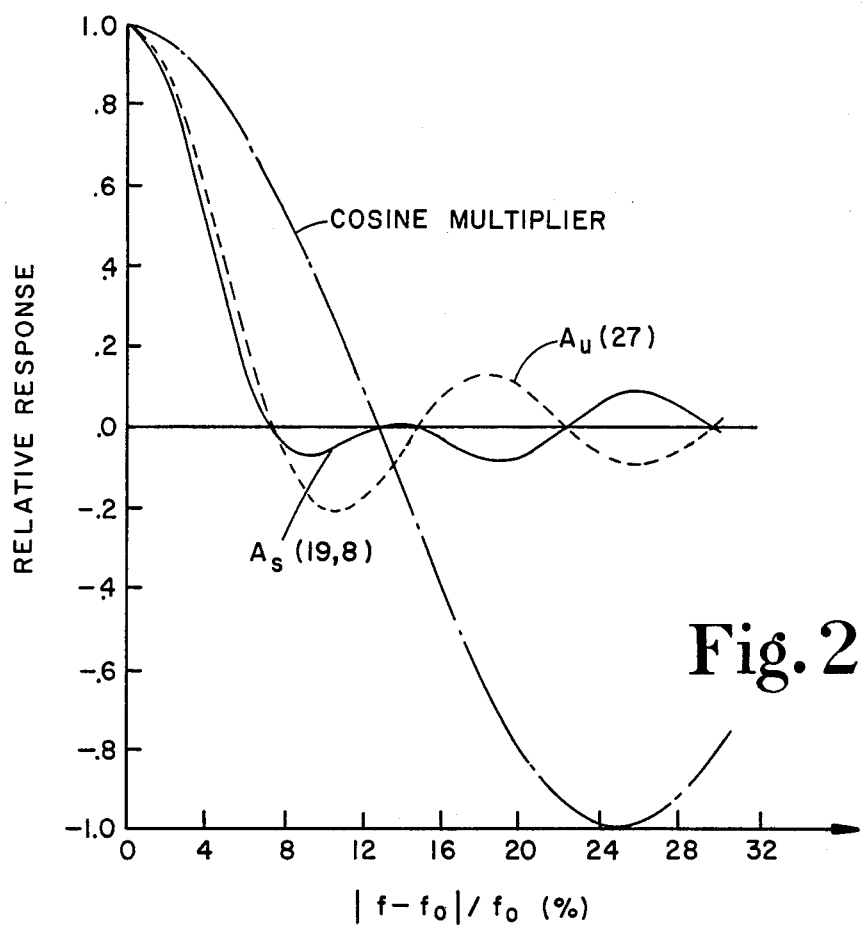
FIGS. 2 and 3 show amplitude versus frequency response characteristics which are useful in facilitating an understanding of the operation of the transducer configuration shown in FIG. 1.

The amplitude versus frequency response characteristic for a uniform transducer in which N is equal to 27 is graphically depicted in FIG. 2 as Au(27). It will be noted that the magnitude of the peak amplitude of the first sidelobe is approximately 20 percent of the magnitude of the peak amplitude of the desired in-band response or, alternately, the magnitude of the peak amplitude of the first sidelobe is only 13.2 dB below the magnitude of the peak amplitude of the desired in-band response.

While input transducer 108 has a uniform aperture pattern, it has an amplitude versus frequency response characteristic including an in-band response substantially the same as that of a corresponding conventional transducer of slightly smaller size, but with out-of-band sidelobes of significantly smaller amplitudes than those of the corresponding conventional uniform transducer as will subsequently be explained. To accomplish this, voltage divider network 112 is selected to couple electrical signals to comb-shaped elements 101 and 103 of the first (left) and second (right) end portions of transducer 108, respectively, from tuner 14 which have amplitudes at least approximately equal to one half the amplitude of the electrical signal coupled to comb-shaped element 102 of the center portion of transducer 108 from tuner 14. As a result, the first and second end portions of transducer 108 generate acoustic signals having amplitudes which are approximately one half the amplitude of the acoustic signal generated by the center portion of transducer 108. If the amplitudes of the acoustic signals generated by the first and second end portions of transducer 108 are substantially equal to one half the amplitude of the acoustic signal generated by the center portion of transducer 108, the combined acoustic signal will have a response which is the multiplicative product of a conventional uniform transducer having a number of pairs of alternated electrodes equal to the number of pairs of alternated electrodes in the center portion of transducer 108 plus the number of pairs of alternated electrodes in either the first or second end portions of transducer 108 (assuming the number of alternated electrodes in the end portions is the same) and a cosine multiplier having a periodicity (in the frequency domain) related to the number of electrodes in either the first or second end portions of transducer 108. Mathematically, this may be expressed as:

$$A_S(NFT, NXT) = A_U(NFT + NXT) \cos\left[\frac{\pi(NXT)(f-fo)}{2fo}\right] \quad (2)$$

where

NFT is the number of pairs of overlap regions between alternated electrodes in the center portion of transducer 108;

NXT is the number of pairs of overlap regions between alternated electrodes in either the first or second end portions;

$A_S$(NFT,NXT) is the composite amplitude versus frequency response of all the portions of transducer 108;

$A_U$(NFT + NXT) is the amplitude versus frequency response of a conventional uniform transducer having NFT plus NXT pairs of overlap regions between alternated electrode pairs; and $f$ and $fo$ are as previously defined above.

As earlier noted, a uniform transducer having N overlap regions between alternated electrodes has the amplitude versus frequency response defined by expression (1). Thus, $$A_U(NFT + NXT) = \frac{\sin\left[\frac{\pi(NFT + NXT)(f-fo)}{2fo}\right]}{\frac{\pi(f-fo)}{2fo}} \quad (3)$$

A graphical representation of the $A_U$ for the case where NFT is equal to 19 and NXT is equal to 8 is shown in FIG. 2 as $A_U$(27). A graphical representation of the cosine multiplier defined in expression (2) for the case where NXT = 8 is shown in FIG. 2 as COS $$\left[\frac{8\pi(f-fo)}{2fo}\right].$$

A graphical representation for composite amplitude versus frequency response characteristics $A_S$ of transducer 108 is shown in FIG. 2 as $A_S$(19,8). The in-band response of $A_S$(19,8) is substantially the same as that of $A_U$(27). In other words, as earlier mentioned, when the amplitudes of the acoustic signals generated by the end portions of transducer 108 are controlled to be substantially equal to one half the amplitude of the acoustic signal generated by the center portion of transducer 108, the in-band response of transducer 108 having NFT overlap between alternated electrodes in its center portion and NXT overlaps between alternated electrodes in each of its end portions is the same as that of a uniform transducer having NFT + NXT overlaps between alternated electrodes. However, it will be noted that the peak magnitude of the first out-of-band sidelobe of $A_S(19,8)$ has been significantly reduced compared with the peak magnitude of the first out-of-band sidelobe of $A_U(27)$. Specifically, the peak magnitude of the first out-of-band sidelobe of $A_S(19,8)$ is approximately −21 dB while the peak magnitude of the first out-of-band sidelobe of $A_U(27)$ is only −13.2 dB.

Other values of NFT and NXT can be chosen. For example, as NXT increases the zero amplitude point of the cosine multiplier is shifted closer to the center frequency fo of the in-band response. However, it is desirable that the zero amplitude point of the cosine multiplier occur substantially at the center of the maximum amplitude point of the first out-of-band sidelobe of $A_U$ so that the maximum amplitude point of composite response $A_S$ is minimized. To accomplish this, NXT should be chosen according to the expression:

$$NXT = \frac{NFT}{2} \qquad (4)$$

On the other hand, since the Q figure of merit of transducer increases, i.e., its 6 dB bandwidth decreases, as the zero amplitude point of the cosine multiplier is moved toward the center frequency fo, it may be desirable to choose NXT larger than the value obtained by expression (4).

Figure 3:
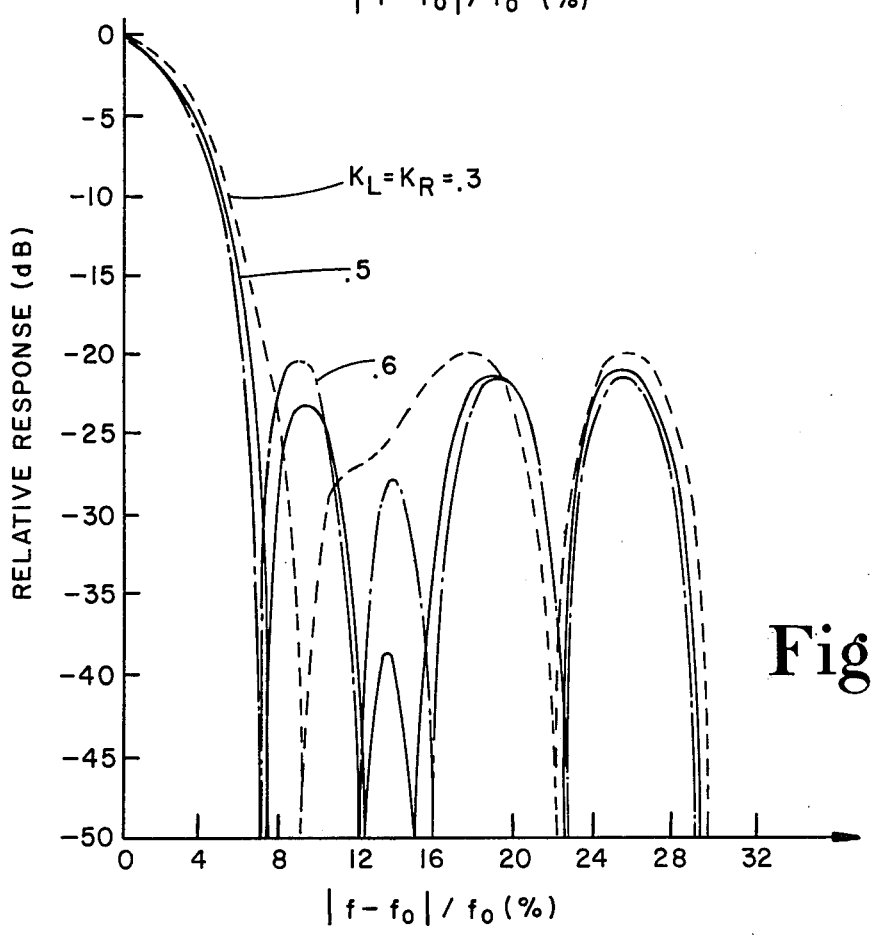

While the discussion thus far has assumed the acoustic signals generated by the end portions of transducer have amplitudes which are substantially equal to one half the amplitude of the acoustic signal generated by the center portion of transducer 108, it has been found that variations of the ratio $K_L$ and $K_R$ between the amplitudes of the acoustic signal generated by the left and right end portions, respectively of transducer 108 and the amplitude of the acoustic signal generated by the center portion of transducer 108 in a predetermined range around one half although effecting the selectivity of transducer 108 will not decrease the selectivity below that desired for the IF portion of a television receiver. FIG. 3 shows graphical representations of amplitude versus frequency response characteristics of transducer 108 with NFT = 18 and NXT = 9 for the cases where $K_L = K_R = 0.3$, 0.5 and 0.6. It is noted that the maximum amplitudes of the in-band and out-of-band sidelobe responses, and therefore the selectivity, remain approximately constant throughout the range between 0.3 and 0.6, but that the locations of the first and second zero amplitude or null points are shifted. As a result, small variations in the value of $K_L$ and $K_R$ will not appreciably affect the selectivity of transducer 108. At any rate, the values of $K_L$ and $K_R$ may be readily controlled by the adjustment of the ratio of the impedance values of capacitor 114 and 116 of voltage divider 112 to compensate for such variations of $K_R$ and $K_L$. To this end, capacitor 116 is made adjustable as shown. Desirably, capacitor 116 may include a capacitance element such as a varactor diode having a capacitance characteristic which is controllable in response to a DC control signal so that the ratio of the impedance values of capacitor 114 and 116 may be in response to a DC control signal generated by a DC control unit 124 which is located at a relatively remote distance within the receiver from IF SAW filter 16 without having to couple the relatively high frequency IF signals over long distances with the accompanying possibility of undesirable RF radiation.

Moreover, if the capacitance of capacitor 116 and as a consequence the values of $K_L$ and $K_R$, are controllable in response to a DC control signal, the position of the zero amplitudes points of the out-of-band sidelobe responses of transducer 108 may be controlled in response to the detection of undesired carriers in the output signal of IF SAW filter 16. To this end, for example, an adjacent channel sound detector 126 including a discriminator circuit having a center frequency at the frequency, e.g., 47.25 MHz, of the lower adjacent sound carrier for generating a DC discriminator signal representing the amplitude of the lower adjacent sound carrier, may be coupled between the output of IF SAW filter 16 and DC control unit 124.

While resistors may replace capacitors 114 and 116 in voltage divider 112, it is desirable to utilize capacitors in voltage divider 112 to minimize overall insertion loss.

In FIG. 4, there is shown another transducer configuration 408 having similar selectivity characteristics to those set forth with respect to transducer 108 of FIG. 1. Transducer 406 includes first, second, third and fourth comb-shaped elements 401, 402, 403 and 404 mounted on one surface of a piezoelectric substrate (not shown). Comb-shaped element 401 and a portion of comb-shaped element 404 have split electrodes thereof interleaved in alternated relationship to form a first (left) end portion of transducer 408. The remaining portion of comb-shaped element 404 and a portion of comb-shaped element 402 have split electrodes thereof interleaved in alternated relationship to form a center portion of transducer 408. The remaining portion of comb-shaped element 402 and comb-shaped element 403 have split electrodes thereof interleaved in alternated relationship to form the second (right) end of transducer 408. The first (left) and second (right) end portions of transducer 408 are identified symbolically by the horizontal lines between the split electrodes of transducers 401 and 404 and transducers 402 and 403, respectively. The center portion of transducer 408 is identified symbolically by the slanted lines between the split electrodes of transducers 402 and 404. As in transducer 108 of FIG. 1, the overlap of each pair of alternated electrodes in transducer 408 is substantially the same so that transducer 408 is a uniform transducer. Furthermore, as in transducer 108 of FIG. 1, the spacings between the center locations (indicated symbolically by dots) of adjacent pairs of alternated electrodes throughout transducer 406 are substantially equal throughout transducer 408 so that although transducer 408 includes two separated comb-shaped elements along its top and bottom portions, it is a continuous transducer.

Comb-shaped element 404 is coupled to signal ground 426. Comb-shaped element 402 is coupled to the output of the tuner (not shown). Comb-shaped elements 402 and 403 are directly connected by a conductor 430.

In operation, assuming that the end portions of transducer 408 have the same electrical impedances, a voltage substantially equal to one half the voltage developed across the center portion of transducer 408 will be developed across the end portions of transducer 408. As a result, the end portions of transducer 408 will generate acoustic signals along the surface of the piezoelectric substrate (not shown) having amplitude substantially equal to one half the amplitude the acoustic signal generated by the center portion of transducer 408. The acoustic signal components generated by the end and center portions of transducer 408 will combine to form a composite acoustic signal having substantially the same desirable amplitude versus frequency response characteristic as that of the composite acoustic signal generated by transducer 108 of FIG. 1 set forth above.

In some applications, the configuration of transducer 408 of FIG. 4 may be desirable over that of transducer 108 of FIG. 1. In transducer 408 of FIG. 4, the voltage division is accomplished internally, while in transducer 108 of FIG. 1 an external voltage division network 112 is required. On the other hand, external voltage divider network 112 associated with transducer 108 enable convenient control of the amplitudes of the acoustic signal generated by the end portions of transducer 108. Some amount of control of the amplitudes of the acoustic signals generated by the end portions of transducer 408 is made possible by coupling a variable capacitor 410 between comb-shaped elements 401 and 404 and a fixed capacitor 442 between comb-shaped elements 402 and 403. Capacitor 440 may comprise a varactor diode so that its capacitance is controlled in response to a DC control signal. However, whereas in the arrangement of FIG. 1 as the capacitance of capacitor 116 is adjusted, the voltages across the end portions of transducer 108 change equally, in the arrangement of FIG. 4, as the capacitance of capacitor 440 is adjusted, the voltages across the end portions of transducer 408 do not change equally. Although this somewhat complicates the analysis of the amplitude versus frequency response characteristic of transducer 408, it may provide some desired response shaping in particular applications.

By comparing transducer 108 of FIG. 1 and transducer 408 of FIG. 4, it should be also noted that in transducer 108 an NFT may only be an even number, in transducer 408 NFT may be only an odd number. Thus, one of transducers 108 of FIG. 1 or 408 of FIG. 4 may be desired over the other depending on the number selected as NFT for a particular in-band response.

In FIG. 5 there is shown still another transducer 550 having a configuration which produces an amplitude versus frequency response characteristic similar to those produced by transducer 108 of FIG. 1 and 408 of FIG. 4. Transducer 550 includes two comb-shaped elements 552 and 554 mounted in a piezoelectric substrate (not shown) with electrodes thereof interleaved in alternated relationship. Comb-shaped element 552 is coupled to the output of the tuner (not shown) and comb-shaped element 554 is coupled to signal ground 526. As is shown, transducer 550 is a uniform transducer. Transducer 550 includes a first end portion 556 and a second end portion 560, indicated symbolically by horizontal lines between the electrodes in each pair of alternated electrodes, and a center portion between end portions 556 and 560, indicated symbolically by slanted lines between the electrodes in each pair of alternated electrodes. The spacing between the electrodes in each pair of alternated electrodes in end portions 556 and 560 is made wider than the spacing between the electrodes in each pair of alternated electrodes in center portion 558. However, the spacings between the center locations between the locations between the electrodes in adjacent pairs of alternated electrodes are substantially equal throughout transducer 550.

In operation, because of the difference in the spacing between the electrodes in each pair of alternated electrodes in end portions 556 and 560 and the spacing between the electrodes in each pair of alternated electrodes in the center portion 558, end portions 556 and 560 convert electrical energy into acoustic energy less efficiently than does center portion 558. By controlling the difference in these spacings, the amplitude of the acoustic signal generated by end portions 556 and 560 can be made at least approximately equal to one half the amplitude of the acoustic signal generated by center portion 558. Under these conditions, the composite acoustic signal will have substantially the same aplitude versus frequency response characteristic as those generated by transducer 108 of FIG. 1 and transducer 408 of FIG. 4.

Transducer 550 may have a disadvantage in comparison to transducers 108 and 408 of FIGS. 1 and 4, respectively, because due to the spacing differences between end portions 556 and 560 and center portion 558 of transducer 550, the periodicity of the electrodes themselves is lost in end portions 556 and 560. Moreover, because of the enlarged spacings in end portions 556 and 560, end portions 556 and 560 cannot easily include split fingers. As a result, SAW devices utilizing a transducer such as transducer 550 will tend to be susceptible to the generation of mechanical reflections between transducers. Furthermore, the amplitudes of the acoustic signals generated by end portions 556 and 560 cannot be externally adjusted with respect to the amplitude of the acoustic signal generated by center portion 558. On the other hand, whereas transducer 108 of FIG. 1 can only have an even NFT and transducer 408 of FIG. 4 can only have an odd NFT, transducer 550 of FIG. 5 can have either an odd or even NFT.

While the present transducer configuration has been described in terms of an input or launching transducer, it should be noted that the present transducer configuration may also be utilized in an output or receiving transducer. This and other modifications are intended to be within the scope of the present invention.

What is claimed is:
1. Apparatus comprising:
   a source of an electrical signal;
   a source of a reference potential;
   a piezoelectric substrate;
   first, second, third and fourth comb-shaped elements, each including a conductor and at least one electrode means extending from said conductor, mounted on one surface of said substrate;
   said first and said fourth comb-shaped elements having respective electrode means thereof interleaved in alternated relationship to form a first end portion of a transducer;
   said third and one of said second and fourth comb-shaped elements having respective electrode means thereof interleaved in alternated relationship to form a second end portion of said transducer;
   said second and fourth comb-shaped elements having respective electrode means thereof interleaved in alternated relationship to form a center portion of said transducer between said first and second end portions;
   each pair of alternated electrode means in said transducer having a region wherein the two electrode means in the pair overlap each other, the amount of overlap for each pair of alternated electrode means being substantially equal;
   each pair of alternated electrode means in said transducer having its location within said transducer determined by the location of a center position substantially midway between the electrode means in the pair, the spacings between the center positions between adjacent pairs of alternated electrode means being substantially equal throughout said transducer;
   means for coupling said fourth comb-shaped element to said source of said reference potential;

means for coupling said electrical signal to said second comb-shaped element, said center portion of said transducer generating an acoustic signal along the surface of said substrate in response to said electrical signal;

attenuation means for coupling attenuated amplitude portions of said electrical signal to said first and third comb-shaped elements, said first and second end portions of said transducer generating acoustic signals along the surface of said substrate in response to said attenuated amplitude portions of said electrical signal having amplitudes less than the amplitude of said acoustic signal generated by said center portion of said transducer.

2. The apparatus recited in claim 1 wherein said first and third comb-shaped elements have equal numbers of electrode means; and said attenuation means causes the amplitudes of the acoustic signals generated by said first and third comb-shaped elements to have amplitudes at least approximately equal to one half the amplitude of the acoustic signal generated by said second comb-shaped element.

3. The apparatus recited in claim 1 wherein said attenuation means includes control means for adjusting the amplitudes of said portions of said electrical signal coupled to said first and third comb-shaped elements relative to the amplitude of said electrical signal.

4. The apparatus recited in claim 3 wherein said control means adjusts the amplitudes of said portions of said electrical signal coupled to said first and third comb-shaped elements in response to a DC control signal.

5. The apparatus recited in claim 1 wherein the spacing between the center positions between adjacent pairs of alternated electrode means throughout said transducer are substantially equal to one half of a wavelength ($V/fo$), where $fo$ is the center frequency of a desired amplitude versus frequency response characteristic of said transducer and $v$ is the effective surface wave velocity in the direction of propagation of said acoustic signals; and the electrode means in each pair of alternated electrode means throughout said transducer include two electrodes spaced apart by one eighth of the wavelength ($V/fo$).

6. The apparatus recited in claim 1 wherein said first, second and third comb-shaped elements are adjacent to each other and are in substantial alignment with respect to each other so that electrode means thereof are directed substantially in the same direction; and said fourth comb-shaped elements so that electrode means thereof are directed in the direction substantially opposite to the direction in which the electrode means of said first, second and third comb-shaped elements are directed.

7. The apparatus recited in claim 6 wherein said attenuation means includes first impedance means coupled between said source of said electrical signal and a circuit point;

a second impedance means coupled between said circuit point and said source of said reference potential; and means for coupling said circuit point to said first and third comb-shaped elements.

8. The apparatus recited in claim 7 wherein at least one of said first and second impedance means includes control means for adjusting the ratio of the magnitudes of said first and second impedance means.

9. The apparatus recited in claim 8 wherein said control means adjusts the ratio of the magnitudes of said first and second impedance means in response to a DC control signal.

10. The apparatus recited in claim 7 wherein said first and third comb-shaped elements have equal numbers of electrodes; and said first and second impedance means have magnitudes substantially equal.

11. The apparatus recited in claim 1 wherein said first and second comb-shaped elements are adjacent to each other and are in general alignment with respect to each other so that electrode means thereof are directed substantially in the same direction; and said third and fourth comb-shaped elements are adjacent to each other and in substantial alignment with respect to each other so that electrode means thereof are directed in the direction substantially opposite to the direction in which the electrode means of said first and second comb-shaped elements are directed, said first comb-shaped element being opposite a portion of said fourth comb-shaped element, the remaining portion of said fourth comb-shaped element being opposite a portion of said second comb-shaped element, the remaining portion of said second comb-shaped element being opposite said third comb-shaped transducer.

12. The apparatus recited in claim 11 wherein said attenuation means includes means for coupling said first comb-shaped transducer to said third comb-shaped transducer.

13. The apparatus recited in claim 12 wherein said means for coupling said first comb-shaped transducer to said third comb-shaped transducer is a conductor having an insignificant impedance directly connected between said first and second comb-shaped transducers.

14. The apparatus recited in claim 13 wherein said first and third comb-shaped elements have equal numbers of electrodes; and said first and third comb-shaped elements have no other electrical connections thereto.

15. Apparatus comprising:

a source of an electrical signal;

a source of a reference potential;

a piezoelectric substrate;

a first and second comb-shaped element, each including a conductor and at least one electrode means extending from said conductor;

means for coupling said electrical signal to said first comb-shaped element;

means for coupling said reference potential to said second comb-shaped element;

said first and second comb-shaped elements being mounted on one surface of said substrate with respective electrode means thereof interleaved in alternated relationship to form a transducer for launching an acoustic signal in response to said electrical signal;

each pair of alternated electrode means in said transducer having a region wherein the two electrode means in the pair overlap each other, the amount of overlap for each pair of alternated electrode means being substantially equal;

each pair of alternated electrode means in said transducer having its location within said transducer determined by the location of a center position substantially midway between the electrode means in the pair, the spacings between the center positions between adjacent pairs of alternated electrode means being substantially equal throughout said transducer;

said transducer having first and second end portions having an equal number of pairs of alternated electrode means and a center portion between said end portions, the electrode means in each pair of alternated electrodes in said end portions being spaced apart by a distance greater than the distance between the electrode means in each pair of alternated electrode means in said center portion so that said end portions of said transducer generate components of said acoustic signal having amplitudes less than the amplitude of the component of the component of said acoustic signal generated by said center portion of said transducer.

16. The apparatus recited in claim 15 wherein the spacings between the center positions between adjacent pairs of alternated electrode means throughout said transducer are substantially equal to one half of a wavelength ($V/fo$), where $fo$ is the center frequency of a desired amplitude versus frequency response characteristic of said transducer and $v$ is the effective surface wave velocity in the direction of propagation of said acoustic signals;

the electrode means in each pair of alternated electrode means in said center portion include two electrodes spaced apart by one eighth of the wavelength ($V/fo$); and the electrode means in each pair of alternated electrode means in said end portions include only one electrode.

17. The apparatus recited in claim 15 wherein the electrode means in each pair of alternated electrodes in said end portions being spaced apart by a predetermined distance with respect to the distance between the electrode means in each pair of alternated electrode means in said center portion so that said end portions of said transducer generate components of said acoustic signal having amplitudes at least approximately equal to one half the amplitude of the component of said acoustic signal generated by said center portion of said transducer.

18. Apparatus comprising:

means for developing an electrical signal;

means for developing a reference potential;

a piezoelectric substrate;

first, second, third and fourth comb-shaped elements, each including a conductor and at least one electrode means extending from said conductor, mounted on one surface of said substrate;

said first and said fourth comb-shaped elements having respective electrode means thereof interleaved in alternated relationship to form a first end portion of a surface acoustic wave transducer;

said third and one of said second and fourth comb-shaped elements having respective electrode means thereof interleaved in alternated relationship to form a second end portion of said transducer;

said second and fourth comb-shaped elements having respective electrode means thereof interleaved in alternated relationship to form a center portion of said transducer between said first and second end portions;

each pair of alternated electrode means in said transducer having a region wherein the two electrode means in the pair overlap each other, the amount of overlap for each pair of alternated electrode means being substantially equal;

each pair of alternated electrode means in said transducer having its location within said transducer determined by the location of a center position substantially midway between the electrode means in the pair, the spacings between the center positions between adjacent pairs of alternated electrode means being substantially equal throughout said transducer;

said fourth comb-shaped element being coupled to said means for developing said reference potential;

said second comb-shaped element being coupled to said means for developing said electrical signal, said center portion of said transducer generating an acoustic signal along the surface of said substrate in response to said electrical signal; and attenuation means for developing first and second electrical portions of said electrical signal having amplitudes at least approximately equal to one half the amplitude of said electrical signal coupled between said first and third comb-shaped elements and said means for developing said electrical signal.

* * * * *

UNITED STATES PATENT AND TRADEMARK OFFICE
CERTIFICATE OF CORRECTION

PATENT NO. : 4,126,838

DATED : November 21, 1978

INVENTOR(S) : Joseph H. McCusker, et al.

It is certified that error appears in the above-identified patent and that said Letters Patent is hereby corrected as shown below:

Column 11, line 55, after "comb-shaped" and before "elements" insert -- element is opposite said first, second and third comb-shaped --

Signed and Sealed this

*Tenth* Day of *April 1979*

[SEAL]

Attest:

RUTH C. MASON
*Attesting Officer*

DONALD W. BANNER
*Commissioner of Patents and Trademarks*

Disclaimer 4,126,838.—*Joseph Henry McCusker* and *Stuart Stanley Perlman*, Princeton, N.J. UNIFORM SURFACE ACOUSTIC WAVE TRANSDUCER CONFIGURATION HAVING IMPROVED FREQUENCY SELECTIVITY. Patent dated Nov. 21, 1978. Disclaimer filed Sept. 19, 1980, by the assignee, *RCA Corporation*.

Hereby enters this disclaimer to claims 1, 2, 5, 6, 7, 10, 11, 12, 13, 14 and 18 of said patent.

[*Official Gazette December 9, 1980.*]